(12) United States Patent
Luo et al.

(10) Patent No.: US 12,538,602 B2
(45) Date of Patent: Jan. 27, 2026

(54) IMAGE SENSOR COMPRISING INNER GRID AND OUTER GRID

(71) Applicant: VisEra Technologies Company Ltd., Hsin-Chu (TW)

(72) Inventors: Jian-Wen Luo, Hsin-Chu (TW); Yu-Chi Chang, Hsin-Chu (TW); Zong-Ru Tu, Hsin-Chu (TW); Po-Hsiang Wang, Hsin-Chu (TW)

(73) Assignee: VISERA TECHNOLOGIES COMPANY LTD., Hsin-Chu (TW)

( * ) Notice: Subject to any disclaimer, the term of this patent is extended or adjusted under 35 U.S.C. 154(b) by 440 days.

(21) Appl. No.: 17/974,491

(22) Filed: Oct. 26, 2022

(65) Prior Publication Data
US 2024/0145511 A1  May 2, 2024

(51) Int. Cl.
H10F 39/00 (2025.01)
H10F 39/18 (2025.01)

(52) U.S. Cl.
CPC ......... H10F 39/807 (2025.01); H10F 39/182 (2025.01); H10F 39/8027 (2025.01); H10F 39/8053 (2025.01); H10F 39/8057 (2025.01); H10F 39/8063 (2025.01)

(58) Field of Classification Search
None
See application file for complete search history.

(56) References Cited

U.S. PATENT DOCUMENTS

| 2017/0092684 A1 | 3/2017 | Chang et al. |
| 2018/0102389 A1 | 4/2018 | Lee |
| 2018/0158864 A1 | 6/2018 | Kim |
| 2020/0365636 A1* | 11/2020 | Chen ............... H10F 39/807 |
| 2022/0293652 A1* | 9/2022 | Chen ............... H10F 39/8053 |
| 2023/0282662 A1* | 9/2023 | Lee ............... H10F 39/182 |
| 2023/0343808 A1* | 10/2023 | Wang ............... H10F 39/8067 |

FOREIGN PATENT DOCUMENTS

TW 201914046 A 4/2019

* cited by examiner

Primary Examiner — Daniel Whalen
(74) Attorney, Agent, or Firm — LIU & LIU

(57) ABSTRACT

An image sensor includes a first sensing unit. The first sensing unit includes a pair of photodiodes formed in a substrate and spaced by a deep trench isolation structure, an outer grid over the pair of photodiodes, a color filter filled in the outer grid, and an inner grid disposed in the color filter. The color filter overlaps the pair of photodiodes. The inner grid includes a first spacer, wherein the first spacer is rotated relative to the deep trench isolation structure.

19 Claims, 9 Drawing Sheets

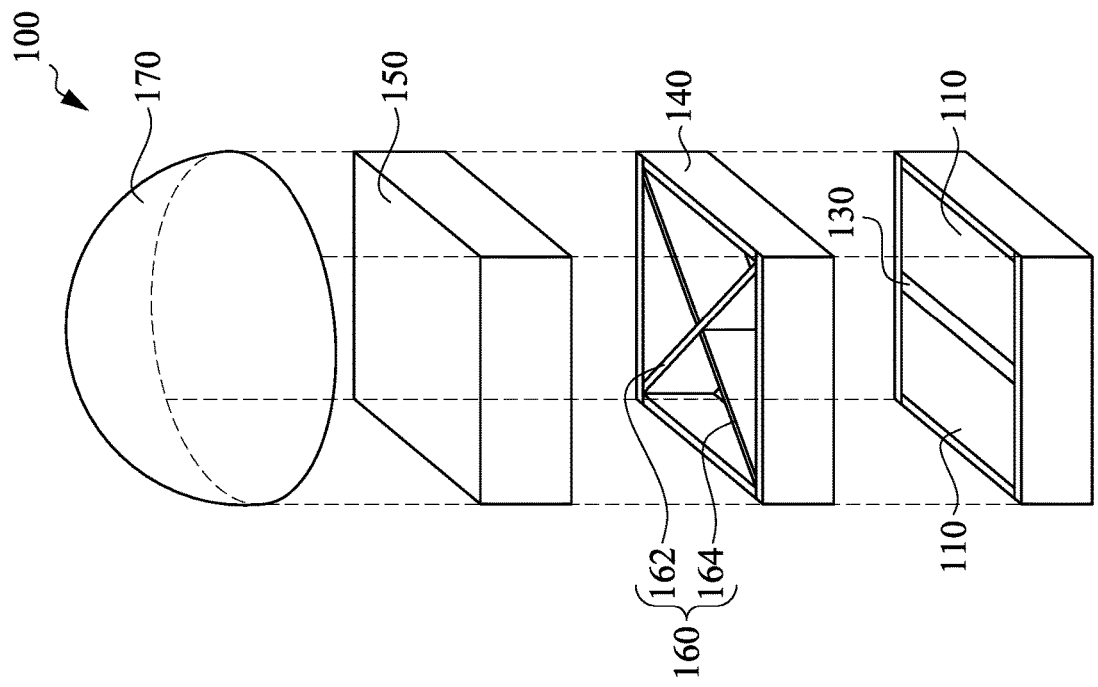
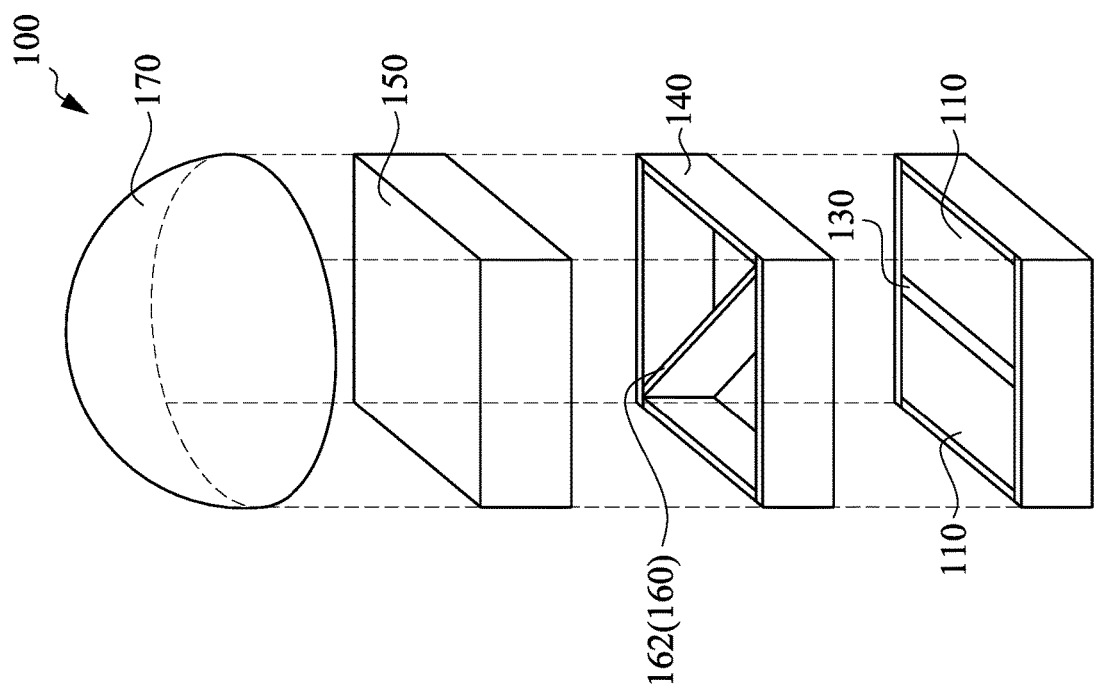

IMAGE SENSOR COMPRISING INNER GRID AND OUTER GRID

BACKGROUND

Field of Invention

The present disclosure relates to an image sensor. More particularly, the present disclosure relates to an image sensor with a rotated grid in a color filter.

Description of Related Art

Image devices have been widely used in various image-capturing apparatuses, for example video cameras, digital cameras and the like. Generally, solid-state imaging devices, for example charge-coupled device (CCD) sensors or complementary metal-oxide semiconductor (CMOS) sensors, have photoelectric transducers such as photodiodes for converting light into electric charges. The photodiodes are formed on a semiconductor substrate such as a silicon chip. Signal charges corresponding to photoelectrons generated in the photodiodes are obtained by a CCD-type or a CMOS-type reading circuit.

SUMMARY

An aspect of the disclosure provides an image sensor including a first sensing unit. The first sensing unit includes a pair of photodiodes formed in a substrate and spaced by a deep trench isolation structure, an outer grid over the pair of photodiodes, a color filter filled in the outer grid, and an inner grid disposed in the color filter. The color filter overlaps the pair of photodiodes. The inner grid includes a first spacer, wherein the first spacer is rotated relative to the deep trench isolation structure.

In some embodiments of the disclosure, a first rotation angle of the first spacer relative to the deep trench isolation structure is in a range from 15 degrees to 45 degrees.

In some embodiments of the disclosure, a gird height of the inner grid is 50~100% of a grid height of the outer grid.

In some embodiments of the disclosure, a grid width of the inner grid is 50~100% a grid width of the outer grid.

In some embodiments of the disclosure, the outer grid includes a buffer layer on the substrate, an absorber material on the buffer layer, and a dielectric material on the absorber material.

In some embodiments of the disclosure, the inner grid comprises the dielectric material on the substrate, without the absorber material between the dielectric material of the inner grid and the deep trench isolation structure.

In some embodiments of the disclosure, the first spacer is connected to the outer grid.

In some embodiments of the disclosure, the first spacer is spaced apart from the outer grid.

In some embodiments of the disclosure, the image sensor further includes a microlens disposed over the color filter, wherein a refractive index of the microlens is in a range from 1.5 to 2.5.

In some embodiments of the disclosure, a refractive index of the inner grid is in a range from 1 to 1.45.

In some embodiments of the disclosure, a shape of each of the pair of photodiodes is a rectangle.

In some embodiments of the disclosure, the inner grid further includes a second spacer disposed orthogonal to the first spacer.

In some embodiments of the disclosure, the second spacer is connected to the outer grid.

In some embodiments of the disclosure, the second spacer is spaced apart from the outer grid.

In some embodiments of the disclosure, the image sensor further includes a second sensing unit. The second sensing unit includes a pair of second photodiodes disposed in the substrate and spaced by a second deep trench isolation structure, a second outer grid over the pair of second photodiodes, a second color filter filled in the second outer grid, and a second inner grid disposed in the second color filter. The second color filter overlaps the pair of second photodiodes. The second inner grid includes a third spacer, wherein the third spacer is rotated relative to the second deep trench isolation structure, and a second rotation angle of the third spacer relative to the second deep trench isolation structure is different from a first rotation angle of the inner grid of the first sensing unit.

In some embodiments of the disclosure, the second rotation angle of the third spacer relative to the second deep trench isolation structure is in a range from 15 degrees to 45 degrees.

In some embodiments of the disclosure, the image sensor has a center intersected by a horizontal axis and a vertical axis of the image sensor, and the first sensing unit is disposed at the center.

In some embodiments of the disclosure, the image sensor further includes a third sensing unit. The third sensing unit includes a pair of third photodiodes disposed in the substrate and spaced by a third deep trench isolation structure, a third outer grid over the pair of third photodiodes, a third color filter filled in the third outer grid, and a third inner grid disposed in the third color filter. The third color filter overlaps the pair of third photodiodes. The third inner grid includes a fourth spacer rotated relative to the third deep trench isolation structure, wherein a third rotation angle of the fourth spacer is determined by an angle between the horizontal axis and the third sensing unit.

In some embodiments of the disclosure, the third rotation angle of the fourth spacer satisfies the following equation:

$$\theta = \theta_0 - \Phi,$$

in which $\theta$ is the third rotation angle of the fourth spacer rotated relative to the third deep trench isolation structure of the third sensing unit, $\theta_0$ is a first rotation angle of the first spacer relative to the deep trench isolation structure, and $\Phi$ is the angle between the horizontal axis and the third sensing unit.

In some embodiments of the disclosure, the deep trench isolation structure between the pair of photodiodes is parallel to the vertical axis of the image sensor.

According to some embodiments of the disclosure, the sensing unit is the dual photodiode unit and has the rotated inner grid disposed in the color filter. The rotated inner grid can split the incident light spot in both horizontal and vertical direction such that the sensing unit can get horizontal and vertical autofocus information according the variation of the light intensity received by the dual photodiodes. The autofocus sensitivity of the image sensor may be improved accordingly.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 5 to FIG. 8 are schematic views of different embodiments of the sensing unit of the image sensor of the disclosure;

DESCRIPTION OF THE EMBODIMENTS

Figure 1:
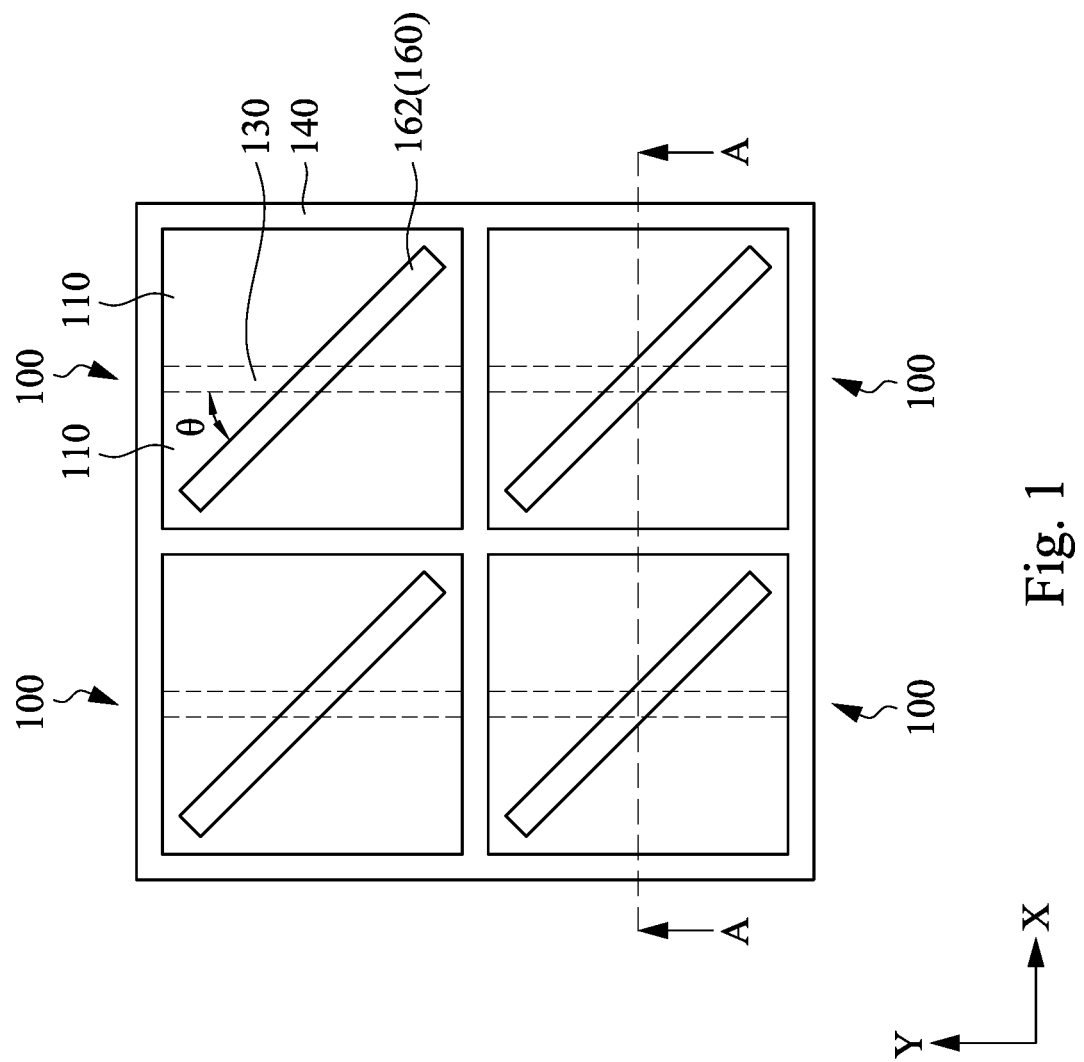
FIG. 1 is a schematic top view of an image sensor according to some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 2:
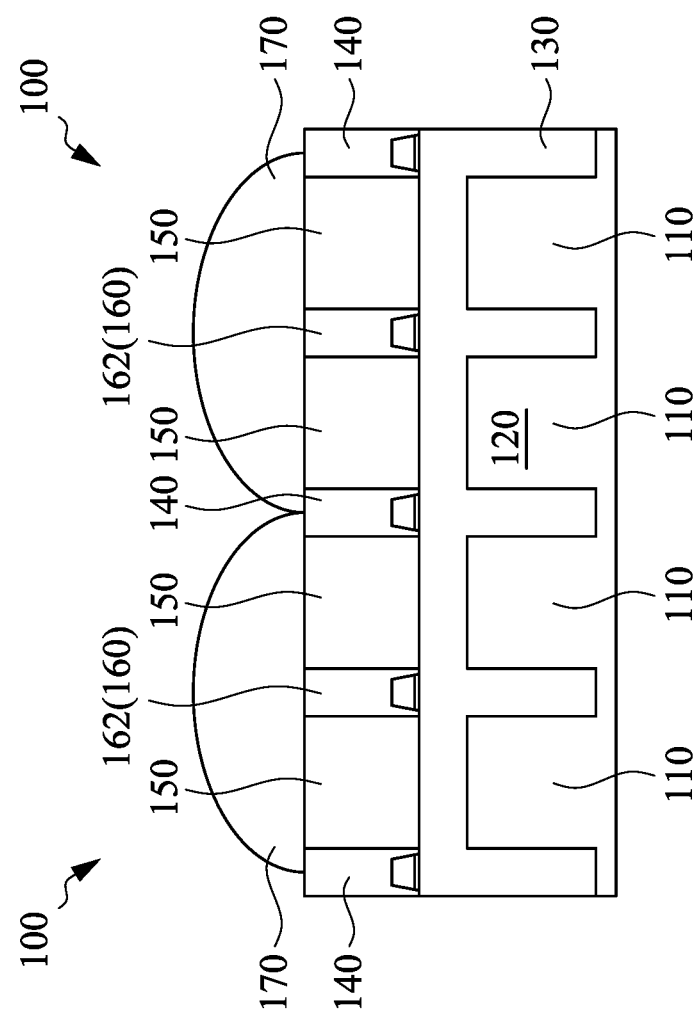
FIG. 2 is a cross-sectional view of the image sensor taken along line A-A of FIG. 1.
Figure 3:
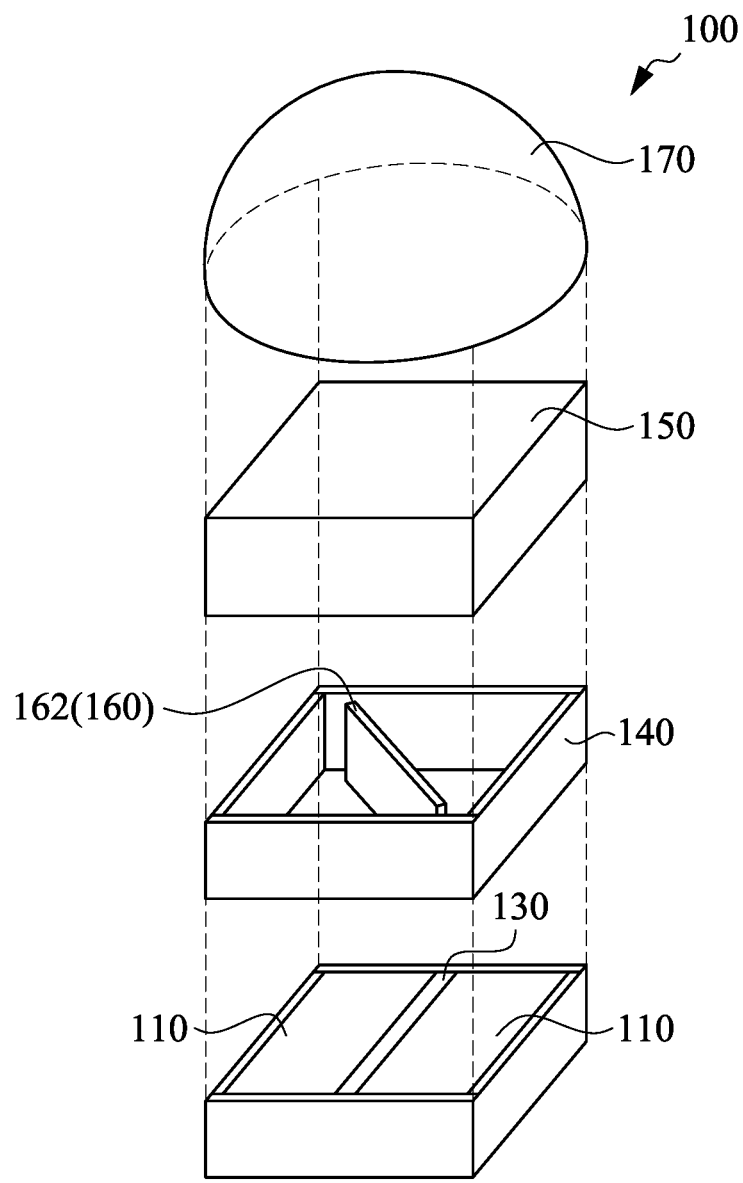
FIG. 3 is a schematic view of a sensing unit of the image sensor of FIG. 1.

Reference is made to FIG. 1 to FIG. 3, in which FIG. 1 is a schematic top view of an image sensor according to some embodiments of the disclosure, FIG. 2 is a cross-sectional view of the image sensor taken along line A-A of FIG. 1, and FIG. 3 is a schematic view of a sensing unit of the image sensor of FIG. 1. It is noted that some components of the image sensor may be omitted in FIG. 1 to FIG. 3 for the sake of brevity.

The image sensor 10 includes a plurality of sensing units 100 arranged in an array. Each of the sensing units 100 includes a pair of photodiodes 110 formed in a substrate 120, the photodiodes 110 are defined and spaced by a deep trench isolation structure 130. Each of the sensing units 100 includes an outer grid 140 disposed over the photodiodes 110. The outer grid 140 defines an aperture, and each of the sensing units 100 includes a corresponding color filter 150 filled in the aperture defined by the outer grid 140. In some embodiments, each of the color filters 150 overlaps two photodiodes 110, and each of the photodiodes 110 is in a shape of rectangle. Thus the sensing unit 100 is also referred as a dual photodiode component. In some embodiments, the color filters 150 may be the combinations of W/GRB/GRBC/RYYB/CMY.

Each of the sensing units 100 further includes an inner grid 160 disposed in the color filter 150. The inner grid 160 has a first spacer 162, in which the first spacer 162 is rotated relative to the deep trench isolation structure 130. The outer grid 140 is configured to separate the color filters 150 to prevent the color mixture, and the inner grid 160 help the dual photodiodes 110 to obtain vertical and horizontal autofocus information. Each of the sensing units 100 further includes a microlens 170 disposed above the color filter 150 to converge lights onto the dual photodiodes 110.

More particularly, the dual photodiodes 110 of the sensing unit 100 are spaced apart by the deep trench isolation structure 130 in a first direction such as X-direction. The dual photodiodes 110 of the sensing unit 100 extend in a second direction such as Y-direction. The first spacer 162 of the inner grid 160 is disposed over the dual photodiodes 110 and the deep trench isolation structure 130. The first spacer 162 of the inner grid 160 is rotated relative to the deep trench isolation structure 130 and extends in a third direction that is different from the first direction and the second direction, in plan view. In some embodiments, an angle θ between the inner grid 160 and the deep trench isolation structure 130 is from 15 degrees to 45 degrees.

Figure 4:
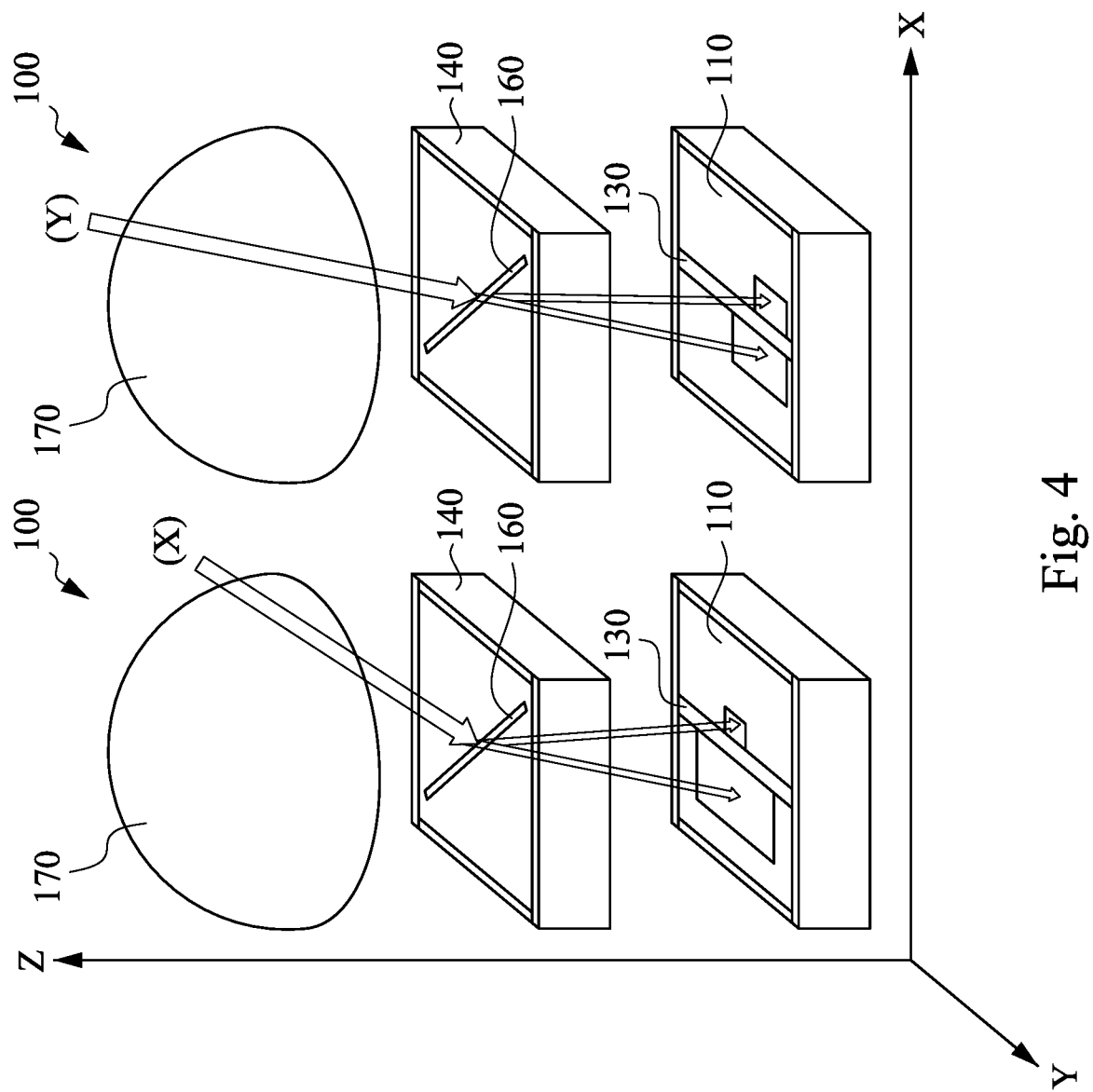
FIG. 4 illustrates an operation mechanism of the sensing unit of FIG. 3.

Reference is made to FIG. 4, which illustrates an operation mechanism of the sensing unit 100 of FIG. 3. Ideally, the incident light converged by the microlens 170 is split by the deep trench isolation structure 130 and is evenly distributed to the photodiodes 110 as an incident light spot. However, in many situations, the incident light to the sensing unit 100 is not always in a normal direction, the incident light spot on the photodiodes 110 may shift and is asymmetric in the dual photodiodes 110.

In a conventional dual photodiode sensing unit, without the inner grid 160 of the disclosure, the movement of the incident light spot in the horizontal direction (e.g. the X-direction) can be easily detected because the light intensity received by the dual photodiodes is varied accordingly, but the movement of the incident light spot in the vertical direction (e.g. the Y-direction) cannot be detected. Thus the autofocus information is incomplete, and the autofocus function of the image sensor is limited.

In the present disclosure, the sensing unit 100 includes the inner grid 160 disposed between the dual photodiodes 110 and the microlens 170. Because the inner grid 160 is rotated relative to the deep trench isolation structure 130 between the dual photodiodes 110, the incident light converged by the microlens 170 is spilt by both the inner grid 160 and the deep trench isolation structure 130. When the movement of the incident light spot happens in the vertical direction, including the situation of the object moving relative to the sensing unit 100 or the sensing unit 100 moving relative to the object, the light intensity received by the dual photodiodes 110 can be varied accordingly. Of course, the movement of the incident light spot happens in the horizontal direction, including the situation of the object moving relative to the sensing unit 100 or the sensing unit 100 moving relative to the object, the light intensity received by the dual photodiodes 110 can be also varied accordingly.

The sensing unit 100 having the rotated inner grid 160 can get horizontal and vertical autofocus information according the variations of the light intensities received by the dual photodiodes 110. The autofocus sensitivity of the image sensor 10 may be improved due to the improvement of detection capability in both horizontal and vertical directions. The angle θ between the inner grid 160 and the deep trench isolation structure 130 (see FIG. 1) is from 15 degrees to 45 degrees. If the angle θ is smaller than 15 degrees or greater than 45 degrees, the autofocus improvement is not obvious.

Reference is made to FIG. 5 to FIG. 8, which are schematic views of different embodiments of the sensing unit of the image sensor of the disclosure. The sensing unit 100 includes the dual photodiodes 110 separated by the deep trench isolation structure 130, the color filter 150 filled in the outer grid 140 and disposed over the dual photodiodes 110, the inner grid 160 disposed in the color filter 150, and the microlens 170 disposed over the color filter 150. The inner grid 160 is rotated relative to the deep trench isolation structure 130, with the rotation angle of 15 degrees to 45 degrees.

In some embodiments, as shown in FIG. 5, the inner grid 160 includes the first spacer 162 rotated relative to the deep trench isolation structure 130, and the first spacer 162 is connected to the outer grid 140.

In some embodiments, as shown in FIG. 6, the inner grid 160 further includes a second spacer 164. The second spacer 164 is disposed orthogonal to the first spacer 162. The first spacer 162 and the second spacer 164 are both rotated relative to the deep trench isolation structure 130, each with the rotation angle of 15 degrees to 45 degrees. The first spacer 162 and the second spacer 164 are both connected to the outer grid 140, and the space between the first spacer 162 and the second spacer 164 is filled with the color filter 150.

Figure 7:
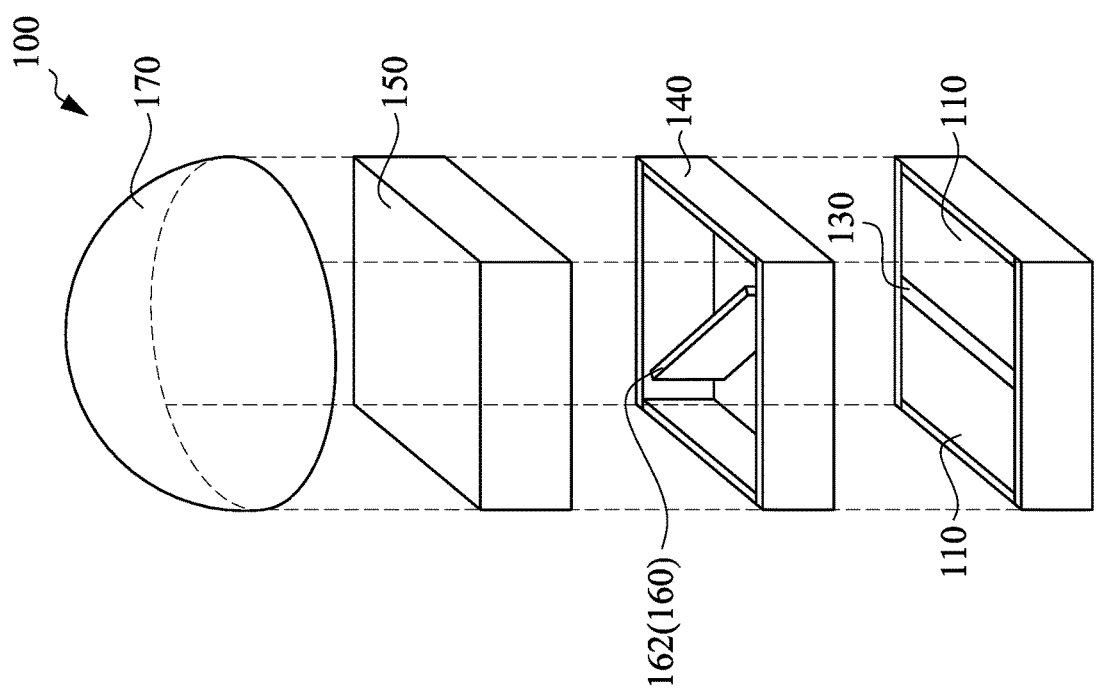

In some embodiments, as shown in FIG. 7, the inner grid 160 includes the first spacer 162 rotated relative to the deep trench isolation structure 130, and the first spacer 162 is spaced apart from the outer grid 140.

Figure 8:
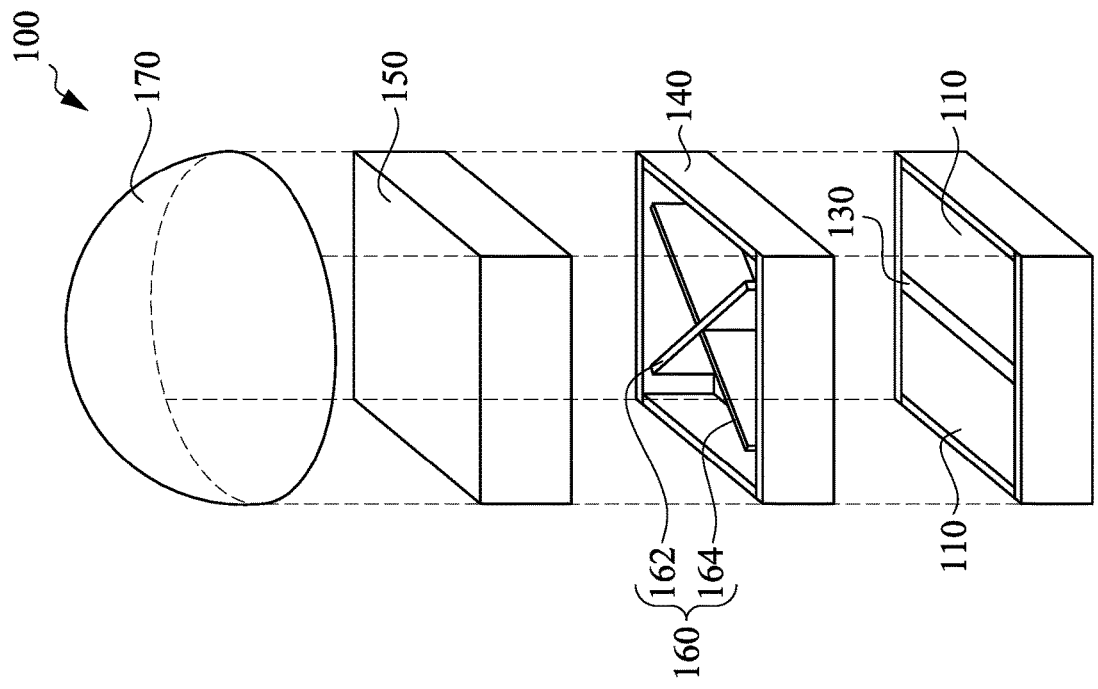

In some embodiments, as shown in FIG. 8, the inner grid 160 includes the first spacer 162 and the second spacer 164. The second spacer 164 is disposed orthogonal to the first spacer 162. The first spacer 162 and the second spacer 164 are both rotated relative to the deep trench isolation structure 130, each with the rotation angle of 15 degrees to 45 degrees. The first spacer 162 and the second spacer 164 are both spaced apart from the outer grid 140, and the space between the first spacer 162 and the second spacer 164 is filled with the color filter 150.

Figure 9:
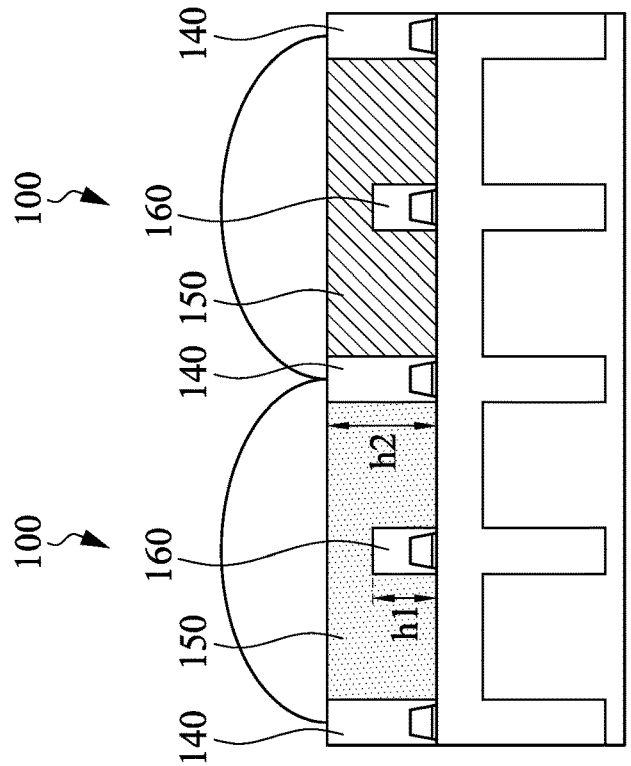
FIG. 9 to FIG. 12 are cross-sectional views of different embodiments of the image sensor of the disclosure.

Reference is made to FIG. 9 to FIG. 12, which are cross-sectional views of different embodiments of the image sensor of the disclosure. As shown in FIG. 9, the image sensor 10 includes the sensing units 100, and the color filters 150 of the adjacent sensing units 100 correspond to different wavebands, respectively. The sensing units 100 are spaced apart by the outer grid 140, and the inner grids 160 are disposed in the color filters 150. In some embodiments, the outer grid 140 and the inner grid 160 are formed by the same fabricating process and have substantially the same structure.

For example, the outer grid 140 and the inner grids 160 include a buffer layer 180 deposited on the substrate 120. The buffer layer 180 may include silicon oxides, silicon nitrides, silicon oxynitrides, or other suitable insulating materials.

The outer grid 140 and the inner grids 160 further include an absorber material 182 on the buffer layer 180, in which the absorber material 182 is configured to absorb the light to prevent color mixture between different sensing units 100. In some embodiments, the absorber material 182 may include tungsten (W), aluminum (Al), metal nitride (e.g., titanium nitride (TiN)), other suitable materials. The absorber material 182 may be formed by depositing a metal layer on the buffer layer 180 and then patterning the metal layer using photolithography and etching processes to form a grid structure.

The outer grid 140 and the inner grids 160 further include a dielectric material 184 formed on the absorber material 182. In some embodiments, the refractive index of the dielectric material 184 of the outer grid 140 and the inner grids 160 is in a range from 1 to 1.45. The refractive index of the dielectric material 184 of the outer grid 140 and the inner grids 160 is lower than the refractive index of the color filters 150.

The refractive index of the microlens 170 is greater than the refractive index of the dielectric material 184 of the outer grid 140 and the inner grids 160. In some embodiment, the refractive index of the microlens 170 is in a range from 1.5 to 2.5.

In some embodiments, the outer grid 140 and the inner grids 160 may have the same grid height, and the top surfaces of the outer grid 140, the color filters 150, and the inner grids 160 are substantially coplanar. In some embodiments, the outer grid 140 and the inner grids 160 may have the same grid width.

Figure 10:
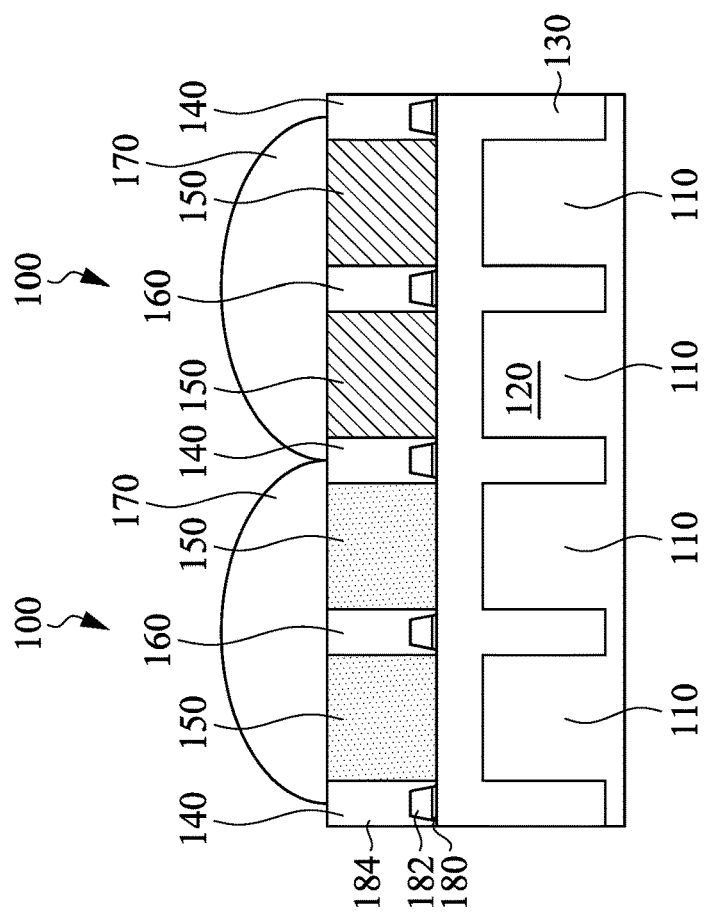

In some other embodiments, as shown in FIG. 10, the outer grid 140 and the inner grids 160 may have different grid heights. For example, the top surface of the outer grid 140 is still level with the top surface of the color filters 150, and the inner grids 160 are shorter than the outer grid 140 such that the inner grids 160 are embedded in the color filters 150, and the top surfaces of the inner grids 160 are covered by the color filters 150. In some embodiments, the grid height h1 of the inner grids 160 is 50-100% of the grid height h2 of the outer grid 140.

Figure 11:
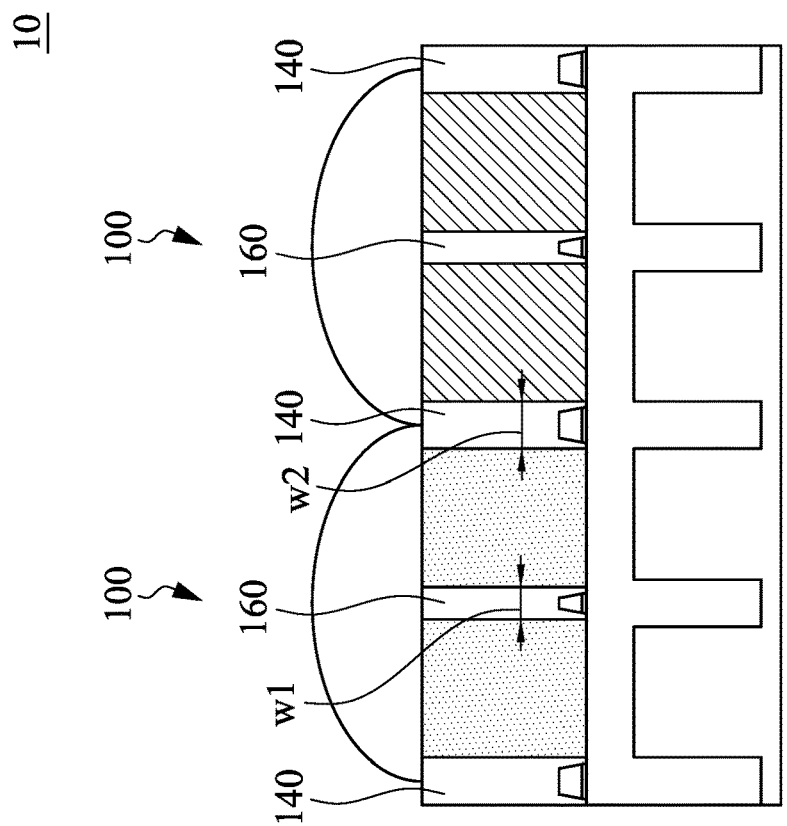

In some other embodiments, as shown in FIG. 11, the outer grid 140 and the inner grids 160 may have different grid widths. For example, the inner grids 160 are thinner than the outer grid 140. In some embodiments, the grid width w1 of the inner grids 160 is 50-100% of the grid width w2 of the outer grid 140.

Figure 12:
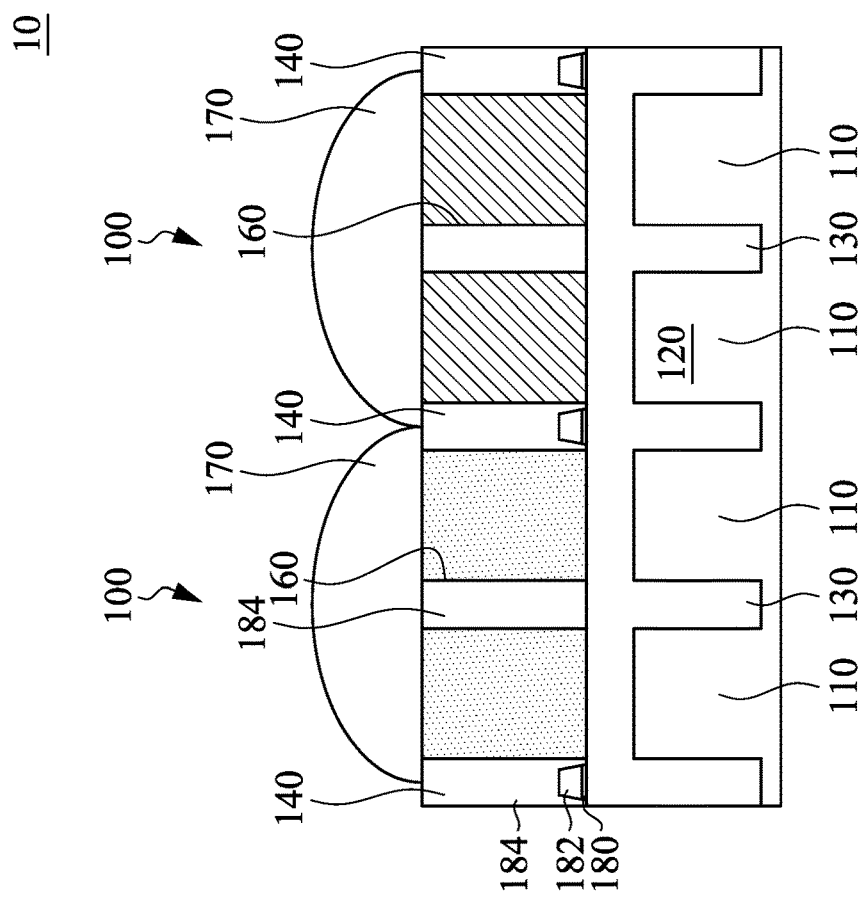

In some other embodiments, as shown in FIG. 12, the outer grid 140 and the inner grids 160 may have different components. For example, the outer grid 140 can be formed including the buffer layer 180, the absorber material 182 on the buffer layer 180, and the dielectric material 184 on the absorber material 182. The inner grids 160 are formed by the dielectric material 184, without the absorber material 182 and the buffer layer 180, such that there is no absorber material 182 between the dielectric material 184 of the inner grids 160 and the deep trench isolation structure 130.

Figure 13:
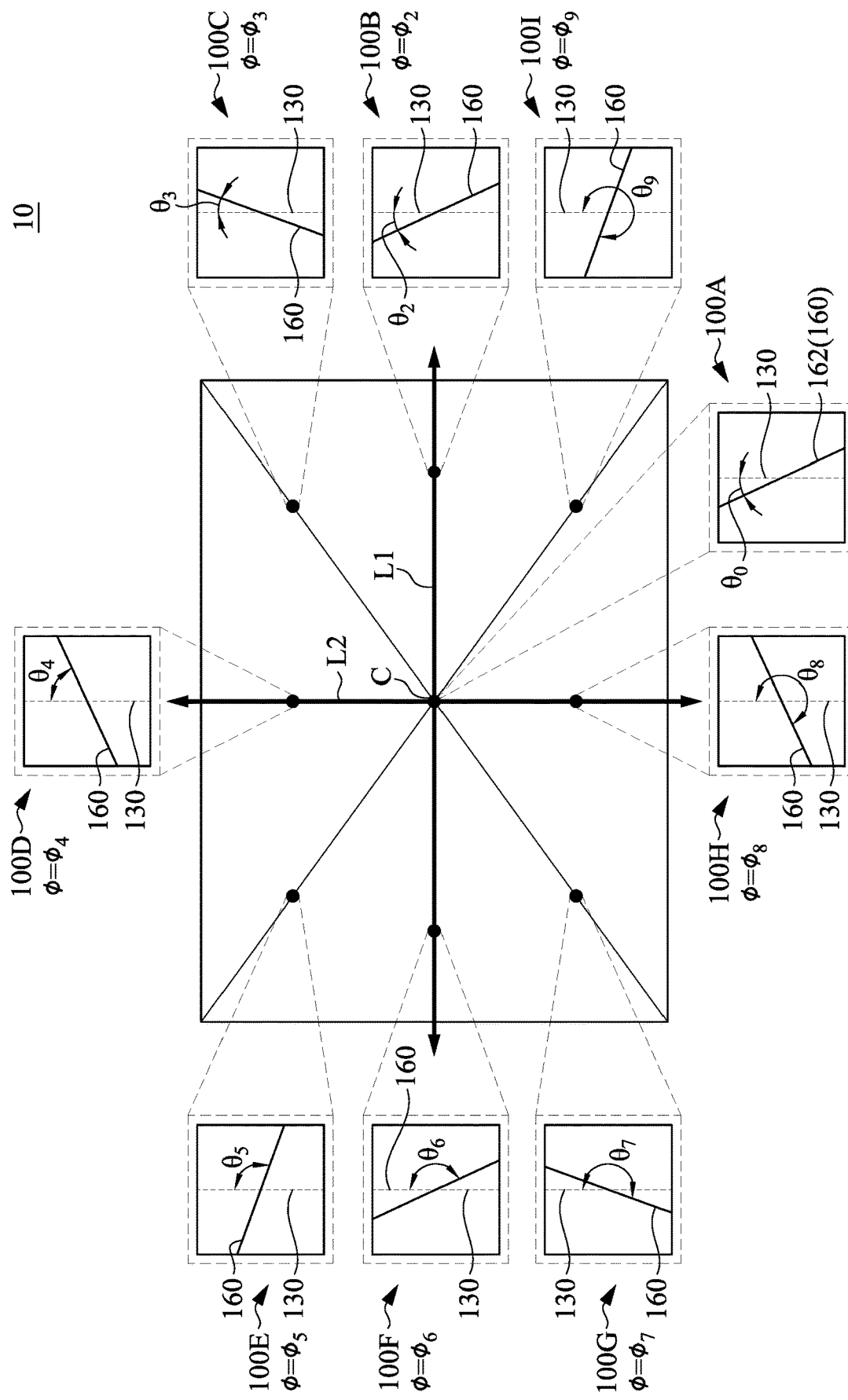
FIG. 13 is a schematic top view of the image sensor according to some embodiments of the disclosure.

Reference is made to FIG. 13, which is a schematic top view of the image sensor according to some embodiments of the disclosure. In some embodiments, the angle between the inner grid 160 and the deep trench isolation structure 130 of each of the sensing units 100 of the image sensor 10 can be varied by the position thereof.

The image sensor 10 has a center C intersected by a horizontal axis L1 and a vertical axis L2 of the image sensor 10, and the first sensing unit 100A is disposed at the center C of the image sensor 10. The deep trench isolation structure 130 of the first sensing unit 100A between the photodiodes 110 is parallel to the vertical axis L2 of the image sensor 10. The rotation angle of the first spacer 162 relative to the deep trench isolation structure 130 of the first sensing unit 100A is referred as a first rotation angle $\theta_0$, and the rotation angle of the sensing unit other than the first sensing unit 100A is determined by the first rotation angle $\theta_0$ and an angle $\Phi$ between the horizontal axis L1 and the sensing unit thereof.

For example, the rotation angle of the spacer of the inner grid of the sensing unit satisfies the following equation:

$\theta = \theta_0 - \Phi$, in which $\theta$ is the rotation angle of the spacer of the inner grid of the sensing unit rotated relative to the deep trench isolation structure of the sensing unit, $\theta_0$ is the first rotation angle of the spacer of the inner grid relative to the deep trench isolation structure, and $\Phi$ is the angle between the horizontal axis and the sensing unit.

In some embodiments, the first rotation angle $\theta_0$ of the first spacer 162 of the inner grid 160 (hereafter as the first rotation angle $\theta_0$) of the first sensing unit 100A is 25 degrees at the center C of the image sensor 10. The first rotation angle $\theta_0$ of the first sensing unit 100A is rotated counterclockwise relative to the deep trench isolation structure 130. Optionally, the inner grid 160 of the first sensing unit 100A may further include the second spacer disposed orthogonal to the first spacer 162.

In some other sensing unit, such as the second sensing unit 100B, an angle $\Phi_2$ between the horizontal axis L1 and the second sensing unit 100B is 0 degree. The second rotation angle $\theta_2$ of the inner grid 160 of the second sensing unit 100B is $\theta_0 - \Phi_2 = 25$ degrees (25 degrees counterclockwise).

In some other sensing unit, such as the third sensing unit 100C, an angle $\Phi_3$ between the horizontal axis L1 and the third sensing unit 100C is 45 degrees. The third rotation angle $\theta_3$ of the inner grid 160 of the third sensing unit 100C is $\theta_0 - \Phi_3 = -20$ degrees, which is rotated 20 degrees clockwise relative to the deep trench isolation structure 130.

In some other sensing unit, such as the fourth sensing unit 100D, an angle $\Phi_4$ between the horizontal axis L1 and the fourth sensing unit 100D is 90 degrees. The fourth rotation angle $\theta_4$ of the inner grid 160 relative to the deep trench isolation structure 130 of the fourth sensing unit 100D is $\theta_0 - \Phi_4 = -65$ degrees (65 degrees clockwise).

In some other sensing unit, such as the fifth sensing unit 100E, an angle $\Phi_5$ between the horizontal axis L1 and the fifth sensing unit 100E is 135 degrees. The fifth rotation angle $\theta_5$ of the inner grid 160 relative to the deep trench isolation structure 130 of the fifth sensing unit 100E is $\theta_0 - \Phi_5 = -110$ degrees (110 degrees clockwise).

In some other sensing unit, such as the sixth sensing unit 100F, an angle $\Phi_6$ between the horizontal axis L1 and the sixth sensing unit 100F is 180 degrees. The sixth rotation angle $\theta_6$ of the inner grid 160 relative to the deep trench isolation structure 130 of the sixth sensing unit 100F is $\theta_0 - \Phi_6 = -155$ degrees (155 degrees clockwise).

In some other sensing unit, such as the seventh sensing unit 100G, an angle $\Phi_7$ between the horizontal axis L1 and the seventh sensing unit 100G is 225 degrees. The seventh rotation angle $\theta_7$ of the inner grid 160 relative to the deep trench isolation structure 130 of the seventh sensing unit 100G is $\theta_0 - \Phi_7 = -200$ degrees (200 degrees clockwise).

In some other sensing unit, such as the eighth sensing unit 100H, an angle $\text{CO}_8$ between the horizontal axis L1 and the eighth sensing unit 100H is 270 degrees. The eighth rotation angle $\theta_8$ of the inner grid 160 relative to the deep trench isolation structure 130 of the eighth sensing unit 100H is $\theta_0 - \Phi_8 = -245$ degrees (245 degrees clockwise).

In some other sensing unit, such as the ninth sensing unit 100I, an angle $\Phi_9$ between the horizontal axis L1 and the ninth sensing unit 100I is 315 degrees. The ninth rotation angle $\theta_9$ of the inner grid 160 relative to the deep trench isolation structure 130 of the ninth sensing unit 100I is $\theta_0 - \Phi_9 = -290$ degrees (290 degrees clockwise).

According to some embodiments of the disclosure, the sensing unit is the dual photodiode unit and has the rotated inner grid disposed in the color filter. The rotated inner grid can split the incident light spot in both horizontal and vertical direction such that the sensing unit can get horizontal and vertical autofocus information according the variation of the light intensity received by the dual photodiodes. The autofocus sensitivity of the image sensor may be improved accordingly.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims and their equivalents.

What is claimed is:
1. An image sensor comprising:
a first sensing unit comprising:
a pair of photodiodes formed in a substrate and spaced by a deep trench isolation structure;
an outer grid over the pair of photodiodes;
a color filter filled in the outer grid, wherein the color filter overlaps the pair of photodiodes; and
an inner grid disposed in the color filter, the inner grid comprising a first spacer, wherein the first spacer is rotated relative to the deep trench isolation structure, wherein a shape of each of the pair of photodiodes is a rectangle, in a top view in a direction normal to a plane parallel to a top surface of the substrate, and the inner grid is disposed above and extends across the pair of photodiodes and the deep trench isolation structure therebetween, wherein the first spacer of the inner grid is an elongated linear structure having a long axis and an orthogonal short axis, a first rotation angle is defined between the long axis of the first spacer and the deep trench isolation structure, and the first rotation angle is in a range from 15 degrees to 45 degrees, in the top view.

2. The image sensor of claim 1, wherein a grid height of the inner grid is 50~100% of a grid height of the outer grid.

3. The image sensor of claim 1, wherein a grid width of the inner grid is 50~100% a grid width of the outer grid.

4. The image sensor of claim 1, wherein the outer grid comprises a buffer layer on the substrate, an absorber material on the buffer layer, and a dielectric material on the absorber material.

5. The image sensor of claim 4, wherein the inner grid comprises the dielectric material on the substrate, without the absorber material between the dielectric material of the inner grid and the deep trench isolation structure.

6. The image sensor of claim 1, wherein the first spacer of the inner grid is connected to the outer grid, in the top view.

7. The image sensor of claim 1, wherein the first spacer of the inner grid is spaced apart from the outer grid, in the top view.

8. The image sensor of claim 1, further comprising a microlens disposed over the color filter, wherein a refractive index of the microlens is in a range from 1.5 to 2.5.

9. The image sensor of claim 1, wherein a refractive index of the inner grid is in a range from 1 to 1.45.

10. The image sensor of claim 1, wherein the inner grid further comprises a second spacer disposed orthogonal to the first spacer, in the top view.

11. The image sensor of claim 10, wherein the second spacer of the inner grid is connected to the outer grid, in the top view.

12. The image sensor of claim 10, wherein the second spacer is spaced apart from the outer grid.

13. The image sensor of claim 1, further comprising a second sensing unit, the second sensing unit comprising:
a pair of second photodiodes disposed in the substrate and spaced by a second deep trench isolation structure;
a second outer grid over the pair of second photodiodes;
a second color filter filled in the second outer grid, wherein the second color filter overlaps the pair of second photodiodes; and
a second inner grid disposed in the second color filter, the second inner grid comprising a third spacer, wherein the third spacer is rotated relative to the second deep trench isolation structure, and a second rotation angle of the third spacer relative to the second deep trench isolation structure is different from a first rotation angle of the inner grid of the first sensing unit.

14. The image sensor of claim 13, wherein the second rotation angle of the third spacer relative to the second deep trench isolation structure is in a range from 15 degrees to 45 degrees, in the top view.

15. The image sensor of claim 1, wherein the image sensor comprises a center intersected by a horizontal axis and a vertical axis of the image sensor, and the first sensing unit is disposed at the center.

16. The image sensor of claim 15, further comprising a third sensing unit, the third sensing unit comprising:
a pair of third photodiodes disposed in the substrate and spaced by a third deep trench isolation structure;
a third outer grid over the pair of third photodiodes;
a third color filter filled in the third outer grid, wherein the third color filter overlaps the pair of third photodiodes; and
a third inner grid disposed in the third color filter, the third inner grid comprising a fourth spacer rotated relative to the third deep trench isolation structure, wherein a third rotation angle of the fourth spacer is determined by an angle between the horizontal axis and the third sensing unit.

17. The image sensor of claim 16, wherein the third rotation angle of the fourth spacer satisfies the following equation:

$$\Theta = \theta_0 - \Phi,$$

in which θ is the third rotation angle of the fourth spacer rotated relative to the third deep trench isolation structure of the third sensing unit,
$\theta_0$ is a first rotation angle of the first spacer relative to the deep trench isolation structure, and
Φ is the angle between the horizontal axis and the third sensing unit.

18. The image sensor of claim 15, wherein the deep trench isolation structure between the pair of photodiodes is parallel to the vertical axis of the image sensor.

19. The image sensor of claim 1, wherein the first spacer intersects the deep trench isolation structure, in the top view.

* * * * *